United States Patent
Cox et al.

(10) Patent No.: US 7,537,158 B1
(45) Date of Patent: May 26, 2009

(54) METHOD FOR DETERMINING PRODUCT COMPATIBILITY

(75) Inventors: Jason A. Cox, Raleigh, NC (US);
Pamela A. Nesbitt, Tampa, FL (US);
Lydia M. Do, Research Triangle Park, NC (US); Lisa A. Seacat, San Francisco, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/145,295

(22) Filed: Jun. 24, 2008

(51) Int. Cl.
*G06F 19/00* (2006.01)

(52) U.S. Cl. ............ 235/385; 235/383; 235/462.01; 705/26

(58) Field of Classification Search ........... 235/375, 235/383, 385, 462.01; 705/26
See application file for complete search history.

(56) References Cited

U.S. PATENT DOCUMENTS

| | | | |
|---|---|---|---|
| 5,938,727 A | 8/1999 | Ikeda | |
| 6,512,919 B2 * | 1/2003 | Ogasawara | 455/422.1 |
| 6,976,627 B1 | 12/2005 | Culp et al. | |
| 7,309,015 B2 * | 12/2007 | Frantz et al. | 235/462.46 |
| 2003/0213844 A1 * | 11/2003 | Yoshida et al. | 235/383 |
| 2006/0190350 A1 | 8/2006 | Maas | |
| 2007/0102521 A1 | 5/2007 | Petersson et al. | |
| 2008/0093448 A1 | 4/2008 | de la Huerga | |
| 2008/0093460 A1 | 4/2008 | Frantz et al. | |

* cited by examiner

*Primary Examiner*—Seung H Lee
(74) *Attorney, Agent, or Firm*—Suiter Swantz pc llo

(57) ABSTRACT

A method for identifying product compatibility comprises retrieving product information for a plurality of products, the plurality of products, storing the product information for the plurality of products on at least one of a first storage device and a second storage device, identifying a first product and a second product as members of a collection of compatible products, aggregating the design codes of each of the members of the collection of compatible products, creating a collection code for the collection of compatible products, assigning the collection code to all members of the collection of compatible products, comparing the first product to the second product, determining whether the first product and the second product are members of the collection of compatible products, and providing a result of the determining whether the first product and the second product are members of the collection of compatible products.

1 Claim, 1 Drawing Sheet

METHOD FOR DETERMINING PRODUCT COMPATIBILITY

TECHNICAL FIELD

The present disclosure relates to a method and system for determining product compatibility.

BACKGROUND

Product compatibility includes mechanical, digital, visual and like compatibility among, for example, items purchased by a user.

SUMMARY

The present application provides a method for comparing goods utilizing a design code including, but not limited to, retrieving product information of a plurality of products, the plurality of products including at least a first product and a second product; storing the product information for the plurality of products on at least one of a first storage device and a second storage device; identifying the first product and the second product as members of a collection of compatible products, each of the members of the collection of compatible products including a design code; aggregating the design codes of each of the members of the collection of compatible products; creating a collection code for the collection of compatible products from an aggregation of the design codes of each of the members of the collection of compatible products; assigning the collection code to all members of the collection of compatible products; comparing the first product to the second product, further including: comparing a first product collection code to a second product collection code; determining whether the first product and the second product are members of the collection of compatible products; and providing a result of the determining whether the first product and the second product are members of the collection of compatible products.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Figure 1:
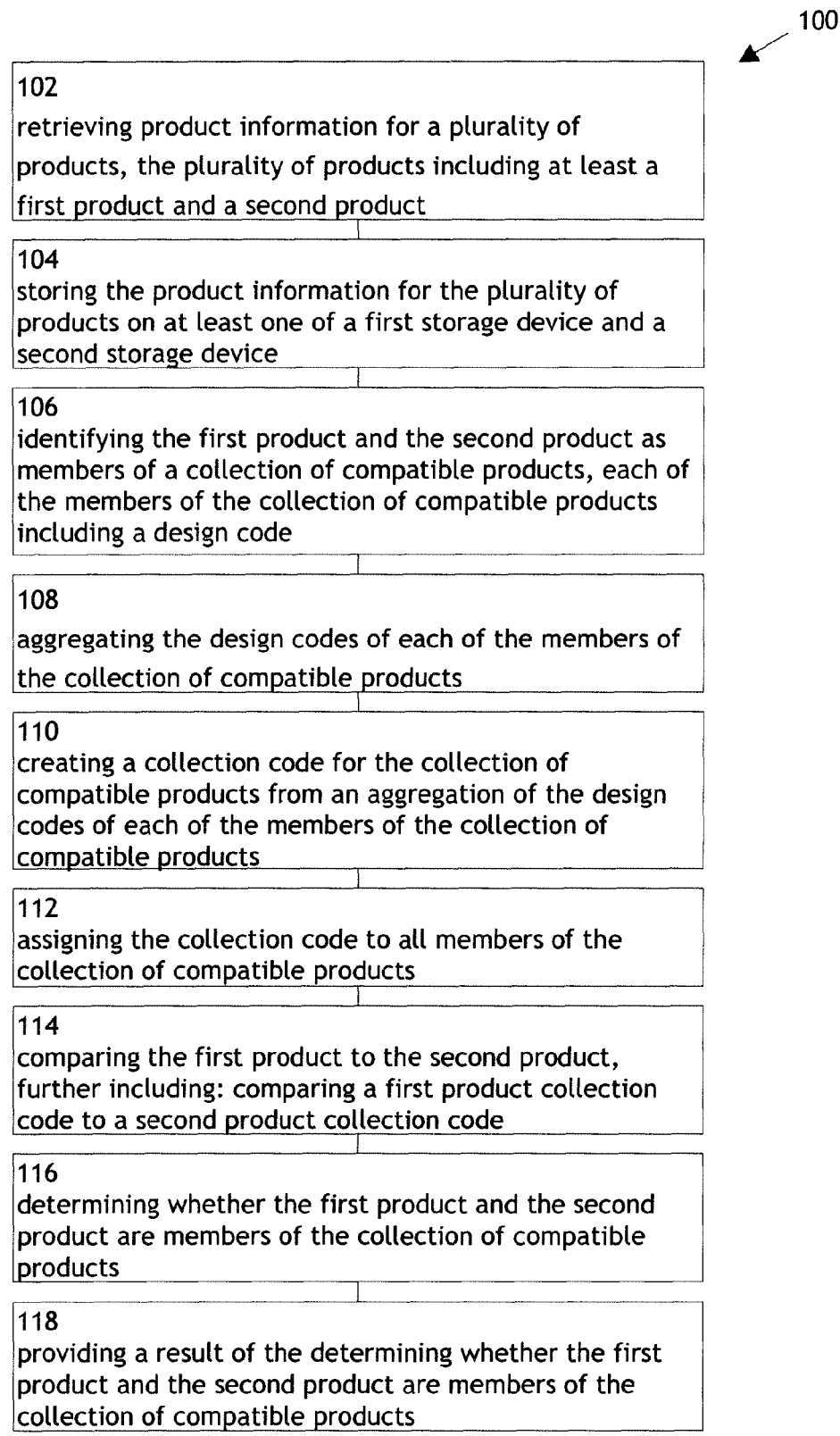
FIG. 1 is a flowchart illustrating a method of storage and process to determine compatibility of goods.

Reference will now be made in detail to the subject matter disclosed, which is illustrated in the accompanying drawings.

Referring to FIG. 1, flow diagram illustrating a method 100 for comparing goods utilizing a design code is shown. Method 100 may include retrieving product information of a plurality of products, the plurality of products including at least a first product and a second product 102. Method 100 may also include storing the product information for the plurality of products on at least one of a first storage device and a second storage device 104. For instance, product information, including compatibility information, may be stored on a server. Product information may also be stored on a scanning device (e.g., a handheld scanning device, a checkout scanning device).

Method 100 further includes identifying the first product and the second product as members of a collection of compatible products, each of the members of the collection of compatible products including a design code 106. In one embodiment, method 100 may include providing a design code to at least the first product and the second product. For instance, the first product and the second product may include a design code applied to a surface of the product, packaging, tag, label, display, including, but not limited to, an in-store display, and/or an internet point of purchase display. Product information (e.g., technical specifications, color, dimensions) may be stored in the design code. When a design code is scanned, product information may be retrieved.

In some embodiments, the design code may be a two-dimensional data matrix code capable of storing a high density of information within a small form factor or design. For instance, a data matrix code may store up to approximately 3,116 numeric or 2,335 alphanumeric characters, or, more than 100 times as much data as a barcode the same size. In addition, a data matrix code may be detected in low contrast, and may be applied directly to products without requiring a label. For instance, design code may be coded utilizing Clear Code (CL code), which provides code capable of being decoded without requiring a dark/light contrast between the code and a background material, allowing the code to be laid on top of media transparently. A two-dimensional data matrix code may be scanned by a two-dimensional vision system and may include information normally read on the backs of boxes and/or in product manuals explaining component compatibility. Further, a two-dimensional matrix code may be detected in any orientation, and may be detected even if damaged. Specifically, because of the high information density in a data matrix code, the data matrix code includes built-in error correction which allows substantial or full recovery of an encoded message even if the code is damaged or missing as much as approximately 20% of the code. Two-dimensional matrix code may also be utilized by an entity (e.g., a retail store, wholesaler, dealer) to identify a compatible item.

In some instances, design code may be a circular barcode (e.g., a shotcode). Circular barcode may include an outer circle surrounding a plurality of of partial or complete concentric circles including an amount of data or code (e.g., datacircles), and a substantially centrally positioned dot (e.g., a target or "bulls eye"). A circular barcode reading device reads databits from one or more of the plurality of partial or complete concentric circles by measuring the angle and distance from the substantially centrally positioned dot to each partial or complete concentric circle. A circular barcode may be read with a camera (e.g., a mobile phone camera and/or a webcam). Software may detect the angle from which the circular barcode is read. Circular barcodes may store a look up number including at least of 49 bits of data. Look-up number may be linked to a server including information regarding a mapped URL which circular barcode reading device may connect to for downloading the included data.

In some instances, design code may be a Semacode barcode. Method 100 may utilize Semacode SDK software to convert a URL into a barcode resembling a crossword puzzle, which may be referred to as a "tag". A tag may be captured with an image capturing device having network capabilities (e.g., a mobile phone camera) and decoded to obtain a website address. The website address may then be accessed via the image capturing device network browser.

In other instances design code may utilize fifth generation media symbology (e.g., PM Code). PM Code may be a device readable code that can hold about 1.236 GB of information (2,854,408,421,376 figures)—Deliver as much information from a printed media symbology (code) to have a phone with the corresponding decode program and a camera play a low-resolution video with sound for approximately 20 seconds, or have the phone reach out automatically to entertainer, advertiser, and manufacturer websites to retrieve additional database stored information via Internet Protocol.

Method 100 may also aggregate the design codes of each of the members of the collection of compatible products 108 and create a collection code for the collection of compatible products from an aggregation of the design codes of each of the members of the collection of compatible products 110. For instance, when multiple design codes are scanned, the information is compared on the server to determine if at least two items are compatible.

Method 100 may assign the collection code to all members of the collection of compatible products 112, and compare the first product to the second product. In one embodiment, the aggregation of design codes generates the collection code. Comparing the first product to the second product may further include comparing a first product collection code to a second collection unique code 114 and determining whether the first product and the second product are members of the collection of compatible products 116. In one embodiment, potential compatibility conflicts may be identified by an application on one of the first and second storage devices (e.g., the server and/or the scanning device). For instance, an application on the server and/or the device may be configured to compare the generated unique code with an expected or desired end result. If the results do not match, the missing or erroneous product may be identified and missing and/or erroneous product information may be provided (e.g., to the user) for corrective action.

Method 100 may provide a result of the determining whether the first product and the second product are members of the collection of compatible products 118. For instance, a conflict among the first product and the second product may be determined, resolved, and reported to the user. Providing the result may be via a display on the first storage device and/or the second storage device (e.g., a handheld scanner).

The design codes may be utilized to consult a database of items owned (e.g., stored in his or her handheld which reads the code). Method 100 may verify compatibility of a new item with the list of stored items. A code may be utilized during a purchase transaction (e.g. at checkout) to identify possible errors made (e.g., mismatched items, etc.).

In one implementation, the method 100 may utilize the design codes of multiple products to determine compatibility of the products. For example, a user picks up various items of a bedroom suite. All items the user picks up are oak, except for the mirror, which is cherry. Method 100 may provide a warning or alert during checkout indicated a potential mismatch among the bedroom suite items (e.g., a cash register may include a program capable of recognizing the broken pattern and warn the cashier or user in the case of self-checkout of the potential mismatch).

In another example, a user may wish to verify compatibility of electronic devices. For instance, the user may purchase a laptop, and one or more peripherals including a mouse and/or a keyboard. The user may have selected an incompatible peripheral (e.g., a serial mouse for a laptop without a serial port). Method 100 may verify compatibility of purchased devices and warn of incompatibility (e.g., produce a message indicating a serial mouse is not compatible with the purchased laptop).

In another implementation, the method 100 may scan the collection code of a desired end product to set a desired end result, and scan the design codes of pieces which would make up the collection. For example, a user may select a furniture configuration (e.g., via a furniture catalogue having a room decorated in a style which the user would like for his or her house). Method 100 may receive a scanned collection code of an item or set of items (e.g., a collection code associated with the furniture configuration provided in the catalogue). Method 100 may compare the received scanned design code to a received in-store scan of one or more items. Method 100 may alert the user that, for example, two items are missing and one item is incorrect. The user may replace an incorrect item with a correct item and complete the transaction.

Method 100 may compare a design code of one device to a set of products already owned. Owned items may be stored in a user profile. A collection code for owned items may also be stored in a user profile. Method 100 may compare the scanned device to preferences, trends, and compatibility details of owned products in the user profile. For example, the user may select an item and scan the design code. Method 100 may receive the scanned design code and compare design code to design code or collection code information stored in the user profile (e.g., on a user computing device either at the location of the scanned item or a geographically distinct location, such as laptop at home). Method 100 may identify a product incompatibility. Method 100 may also provide an alternative product based on user profile information (e.g., a different printer in the store which might better suit the user since the information notes that most of the user's peripherals are high quality and presumes that the user might prefer a higher quality printer). Method 100 may also provide supplemental product information (e.g., differences and benefits of an alternate product).

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method for identifying product compatibility comprising:

retrieving product information for a plurality of products via at least one of a first storage device or a second storage device, the plurality of products including at least a first product and a second product;

storing the product information for the plurality of products on at least one of the first storage device or the second storage device;

identifying the first product and the second product as members of a collection of compatible products via at least one of the first storage device or the second storage device, each of the members of the collection of compatible products including a design code;

aggregating the design codes of each of the members of the collection of compatible products via a server;

creating a collection code for the collection of compatible products from an aggregation of the design codes of each of the members of the collection of compatible products via at least one of the first storage device or the second storage device;

assigning the collection code to all members of the collection of compatible products;

comparing the first product to the second product via an application on at least one of the first storage device or the second storage device, further including:
  comparing a first product collection code to a second product collection code;
determining whether the first product and the second product are members of the collection of compatible products via at least one of the first storage device or the second storage device; and
providing a result of the determining whether the first product and the second product are members of the collection of compatible products via a display on at least one of the first storage device or the second storage device.

* * * * *